United States Patent
Bhosle et al.

(10) Patent No.: US 9,196,489 B2
(45) Date of Patent: Nov. 24, 2015

(54) ION IMPLANTATION BASED EMITTER PROFILE ENGINEERING VIA PROCESS MODIFICATIONS

(71) Applicant: Varian Semiconductor Equipment Associates, Inc., Gloucester, MA (US)

(72) Inventors: Vikram Bhosle, North Reading, MA (US); Bon-Woong Koo, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/750,287

(22) Filed: Jan. 25, 2013

(65) Prior Publication Data

US 2014/0213014 A1    Jul. 31, 2014

(51) Int. Cl.
| | |
|---|---|
| *H01L 21/265* | (2006.01) |
| *H01J 37/08* | (2006.01) |
| *H01L 31/18* | (2006.01) |
| *H01L 31/068* | (2012.01) |
| *H01J 27/02* | (2006.01) |

(52) U.S. Cl.
CPC ........... *H01L 21/26513* (2013.01); *H01J 37/08* (2013.01); *H01L 31/068* (2013.01); *H01L 31/1804* (2013.01); *H01J 2237/0815* (2013.01); *H01J 2237/0827* (2013.01); *H01J 2237/31711* (2013.01)

(58) Field of Classification Search
CPC ................... H01L 21/26513; H01J 37/32412; H01J 37/3171; H01J 2237/0827
USPC .......................... 438/527, 530, 57; 250/423 R
See application file for complete search history.

(56) References Cited

U.S. PATENT DOCUMENTS

| | | |
|---|---|---|
| 2008/0200015 A1 | 8/2008 | Miller et al. |
| 2009/0032728 A1* | 2/2009 | DiVergilio et al. ........... 250/424 |
| 2009/0227094 A1* | 9/2009 | Bateman et al. ............. 438/514 |
| 2009/0236547 A1* | 9/2009 | Huang et al. ............. 250/492.21 |
| 2010/0193708 A1* | 8/2010 | Tabat et al. ................. 250/492.3 |
| 2010/0197126 A1* | 8/2010 | Bateman et al. ............. 438/527 |
| 2011/0000896 A1* | 1/2011 | Hadidi et al. ............ 219/121.59 |
| 2011/0139229 A1* | 6/2011 | Rohatgi et al. ................. 136/255 |

OTHER PUBLICATIONS

Komatsu, Yuji, et al., Innovative Diffusion Processes For Improved Efficiency on Industrial Solar Cells by Doping Profiile Manipulation, 24th European Photovoltaic Solar Energy Conference and Exhibition, Sep. 2009, Hamburg, Germany.

* cited by examiner

*Primary Examiner* — Victor A Mandala
*Assistant Examiner* — Regan J Rundio

(57) ABSTRACT

A method of tailoring the dopant profile of a workpiece by modulating one or more operating parameters is disclosed. In one embodiment, the workpiece may be a solar cell and the desired dopant profile may include a heavily doped surface region and a highly doped region. These two regions can be generated by varying one or more of the parameters of the ion implanter. For example, the extraction voltage may be changed to affect the energy of the implanted ions. The ionization energy can be changed to affect the species of ions being generated from the source gas. In another embodiment, the source gasses that are ionized may be changed to affect the species being generated. After the implant has been performed, thermal processing is performed which minimizes the diffusion of the ions in the workpiece.

8 Claims, 4 Drawing Sheets

ION IMPLANTATION BASED EMITTER PROFILE ENGINEERING VIA PROCESS MODIFICATIONS

FIELD

Embodiments of the present invention relate to methods of achieving particular dopant profiles, and, more particularly, to dopant profiles in solar cells.

BACKGROUND

Solar cells are semiconductor workpieces that include emitter regions, which may be p-type doped, and surface fields, which may be n-type doped. Solar cells utilize a pn junction, created between the emitter regions and the surface fields, to generate electrical current in the presence of photons. To carry this produced current from the workpiece, contact regions are disposed on the surface of the workpiece. These contact regions are exposed areas of doped semiconductor, and are used to electrically connect the semiconductor structures, which are contained within the workpiece, to the exterior of the workpiece. In some high efficiency solar cells, such as interdigitated back contact (IBC) solar cells, the contact regions for the emitter regions and the surface fields are located on one surface of the workpiece. In other solar cell structures, the contact regions of the emitter region and surface fields may be located on two opposing surfaces of the workpiece.

The manufacture of high efficiency solar cells has many, often conflicting, requirements. For example, screen printed contacts typically require specific dopant profiles for proper solar cell performance. These contacts require high interstitial dopant concentrations at the surface of the substrate. Current solar cell manufacturing methods may use fired paste contacts with a single dopant, such as phosphorus, to achieve this high concentration. However, achieving a high surface concentration may require a high concentration of the dopant to be introduced throughout the emitter of the solar cell. This high concentration of dopant throughout the emitter increases carrier recombination and, consequently, may lower cell efficiency. Thus, contacts between the emitter and the contacts are improved by introducing high dopant concentrations near the contact regions. However, the introduction of this dopant throughout the emitter degrades solar cell performance.

Another issue is that recombination of electron-hole (e-h) pairs at the surface of a solar cell typically limits solar cell efficiency. This recombination can be reduced by repelling minority carriers from the surface of the solar cell. One way to repel minority carriers is to put a shallow, high concentration layer of dopant at the surface of the solar cell. This layer needs to remain in place throughout any subsequent thermal processing. However, previous methods would diffuse this dopant layer throughout the emitter, reducing its effectiveness.

While the above criteria require a shallow, high concentration at the surface of the substrate, other criteria may require a deeper dopant concentration. One example of such a solar cell criteria is a p-n junction. Efficiency is enhanced if the p-n junction is located deep within the substrate, away from the surface of the substrate. The presence of a deep dopant profile also may lower series resistance of the solar cell. This deeper dopant concentration has been previously performed using a high-diffusivity dopant. Such a high-diffusivity dopant may not allow high concentration of the dopant at the surface of the cell without introducing an excessive number of dopant atoms into the silicon, thereby increasing recombination.

Thus, current solar cell design is limited by the dopant profiles that can be achieved by diffusing dopants into the silicon of the solar cell. Accordingly, there is a need in the art for improved dopant profiles for solar cells and, more particularly, a method that simply and cost-effectively creates a dopant profile optimized for solar cells.

SUMMARY

Methods of achieving improved dopant profiles, particularly for solar cells, are disclosed. An implant system comprising an ion source in communication with a gas source and an ionization power supply, and an extraction electrode in communication with an extraction power supply is used. According to one embodiment, the method includes introducing a gas comprising a dopant from the gas source into the ion source; energizing the ion source using the ionization power supply to create ions from the gas; energizing the extraction electrode at a first extraction voltage using the extraction power supply so as to extract the ions from the ion source and direct the ions toward the workpiece with a first energy; implanting the ions at a first depth; energizing the extraction electrode at a second extraction voltage, lower than the first extraction voltage, using the extraction power supply so as to extract the ions from the ion source and direct the ions toward the workpiece with a second energy, lower than the first energy; implanting the ions at a second depth, the second depth less than the first depth; and performing a thermal cycle so as to allow the dopant to diffuse into the workpiece.

A second embodiment comprises introducing a first gas comprising a dopant from the gas source into the ion source; energizing the ion source at a first ionization voltage using the ionization power supply to create a first set of ions from the gas; energizing the extraction electrode at an extraction voltage using the extraction power supply so as to extract the first set of ions from the ion source and direct the ions toward the workpiece; implanting the first set of ions at a first depth; energizing the ion source at a second ionization voltage, lower than the first ionization voltage, using the ionization power supply to create a second set of ions; energizing the extraction electrode at an extraction voltage using the extraction power supply so as to extract the second set of ions from the ion source and direct the ions toward the workpiece; implanting the second set of ions at a second depth, the second depth less than the first depth; and performing a thermal cycle so as to allow the dopant to diffuse into the workpiece.

A third embodiment comprises introducing a first gas comprising a dopant from the gas source into the ion source; energizing the ion source at an ionization voltage using the ionization power supply to create a first set of ions from the first gas; energizing the extraction electrode at an extraction voltage using the extraction power supply so as to extract the first set of ions from the ion source and direct the ions toward the workpiece; implanting the first set of ions at a first depth; introducing a second gas comprising the dopant from the gas source into the ion source; energizing the ion source at an ionization voltage using the ionization power supply to create a second set of ions from the second gas; energizing the extraction electrode at an extraction voltage using the extraction power supply so as to extract the second set of ions from the ion source and direct the ions toward the workpiece; implanting the second set of ions at a second depth; and performing a thermal cycle so as to allow the dopant to diffuse into the workpiece.

In some embodiments, a plurality of these techniques is used simultaneously. For example, the source gasses may be varied while also varying the ionization energy.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the process described herein may be performed by, for example, a beam-line ion implanter or a plasma doping ion implanter. Such a plasma doping ion implanter may use RF or other plasma generation sources. Other plasma processing equipment or equipment that generates ions also may be used. Thermal or furnace diffusion, pastes on the surface of the solar cell substrate that are heated, epitaxial growth, or laser doping also may be used to perform embodiments of the process described herein. Furthermore, while a silicon solar cell is specifically disclosed, other solar cell substrate materials also may benefit from embodiments of the process described herein.

Figure 1:
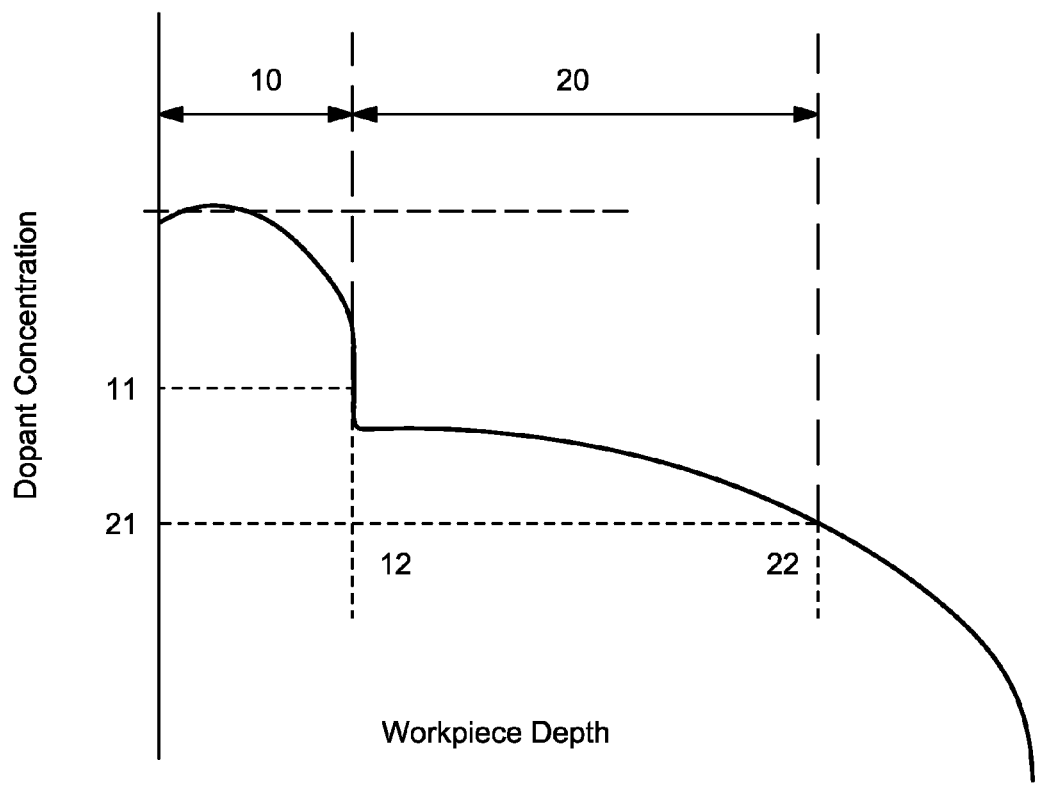
FIG. 1 is a representative graph showing a dopant profile.

FIG. 1 shows a representative dopant profile that may be advantageous in solar cell design. In this graph, the horizontal axis represents the depth into the workpiece, where a value of 0 (i.e. the vertical axis) represents the surface of the workpiece. The vertical axis represents the desired concentration of dopant in the workpiece at this depth. At the region closest to the surface, the concentration of dopant is increased so as to create a heavily doped surface region 10. The depth 12 of the heavily doped surface region may vary, and in one embodiment may be between 1 and 200 nm. In one particular embodiment, the heavily doped surface region is defined as the region where the concentration of dopant is greater than a first threshold 11, such as between $5 \times 10^{19}$ and $3 \times 10^{20}$. Beneath the heavily doped surface region 10 is the highly doped region 20, which extends from the depth 12 of the heavily doped surface region to a second depth 22, which may be between 100 and 1500 nm. In one particular embodiment, the highly doped region is defined as the region where the concentration of dopant is less than the first threshold 11, but greater than a second lower threshold 21, such as $1 \times 10^{18}$.

The greater dopant concentration in the heavily doped surface region 10 allows higher fill factor (FF), which improves efficiency. The control of highly doped region allows for an optimal open circuit voltage (Voc), and short circuit current (Isc), which also improves efficiency.

Figure 2:
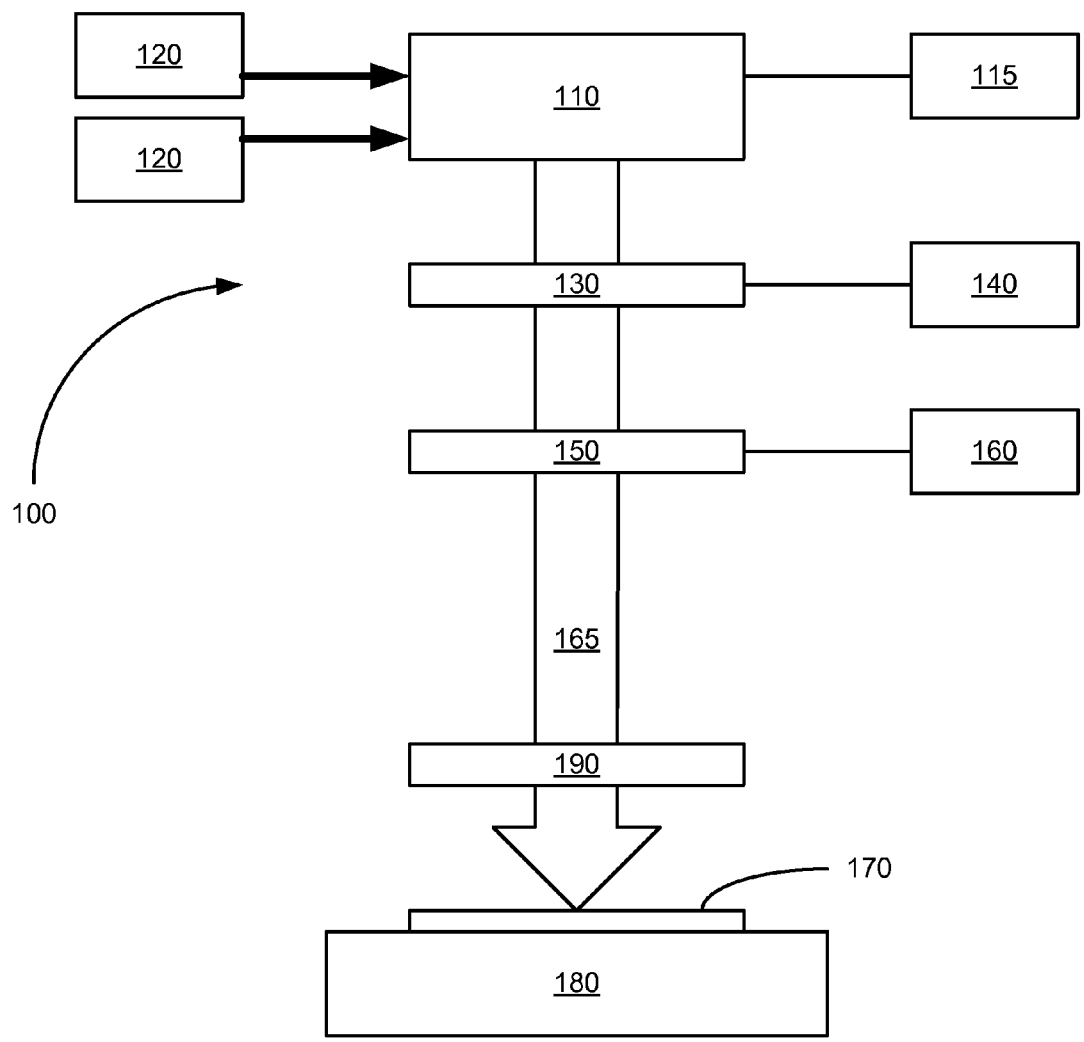
FIG. 2 is a representative drawing of an ion implant system that may be used with an embodiment of the present invention.

The desired dopant profile may be achieved using the system of FIG. 2. The system 100 comprises an ion source 110, which is used to create ionized atoms and molecules for implantation. This ion source 110 is in communication with one or more gas sources 120, which supply the molecules and atoms that are to be ionized. The ion source 110 may be of any suitable type, including an indirect heated cathode (IHC), an RF-based ion source and others. The ion source 110 may be in electrical communication with an ionizing power supply 115, which supplies the power needed to ionize the gas from the gas source 120. A gas of a first species is flowed from the gas source 120 into the ion source 110. The ion source 110 creates ions derived from the flowed gas. Suitable gases include, for example, hydrides, such as $B_2H_6$, $PH_3$, and others, and fluorides, such as $BF_3$, $B_2F_4$, $PF_3$ and others. Of course, other gases may be used and these are merely listed as examples. The energy used to create ions from these gases can be determined by experimentation, or may be known by those of ordinary skill in the art.

The positive ions generated by the ion source 110 are extracted from the ion source 110 through the use of an extraction electrode 130. The extraction electrode 130 is in communication with an extraction power supply 140, which applies a negative voltage applied to the extraction electrode 130 so as to attract the ions to it. These ions pass through an aperture in the extraction electrode 130. In some embodiments, a suppression electrode 150, having an aperture through which the extracted ions may pass, is also used which serves to maintain the desired beam quality. The suppression electrode 150 may be connected to a suppression power supply 160, and may be at a voltage different than that of the extraction electrode 130. The resulting ion beam 165 travels until contacting the workpiece 170. The workpiece 170 may be disposed on a workpiece support 180. The workpiece support 180 may allow movement in one or more directions normal to the path of the ion beam 165, as is known in the art. In some embodiments, a mask 190 may be inserted in the path of the ion beam 165 between the extraction electrode 130 and the workpiece 170. In certain embodiments, the mask 190 is affixed to the workpiece support 180 so that the workpiece 170 and mask 190 maintain a fixed spatial relationship.

In a first embodiment, to achieve the deeper penetration required by the highly doped region 20 (see FIG. 1), the magnitude of the voltage supplied by the extraction power supply 140 to the extraction electrode 130 may be increased. This increase causes the ions to exit the ion source 110 with increased energy, and thus penetrate deeper into the workpiece 170. The heavily doped surface region 10 of the workpiece can be achieved by reducing the magnitude of the voltage supplied by the extraction power supply 140 to the extraction electrode 130, thereby reducing the energy of the ions in the ion beam 165.

Thus, by cycling the magnitude of the voltage supplying by extraction power supply 140 to the extraction electrode 130 between at least two different values, it is possible to generate ion beams 165 of different energies. These different ion beams will therefore penetrate the workpiece 170 to different depths, thereby allowing the dopant profile shown in FIG. 1 to be achieved. Of course, other dopant profiles may also be created using this technique.

Figure 3:
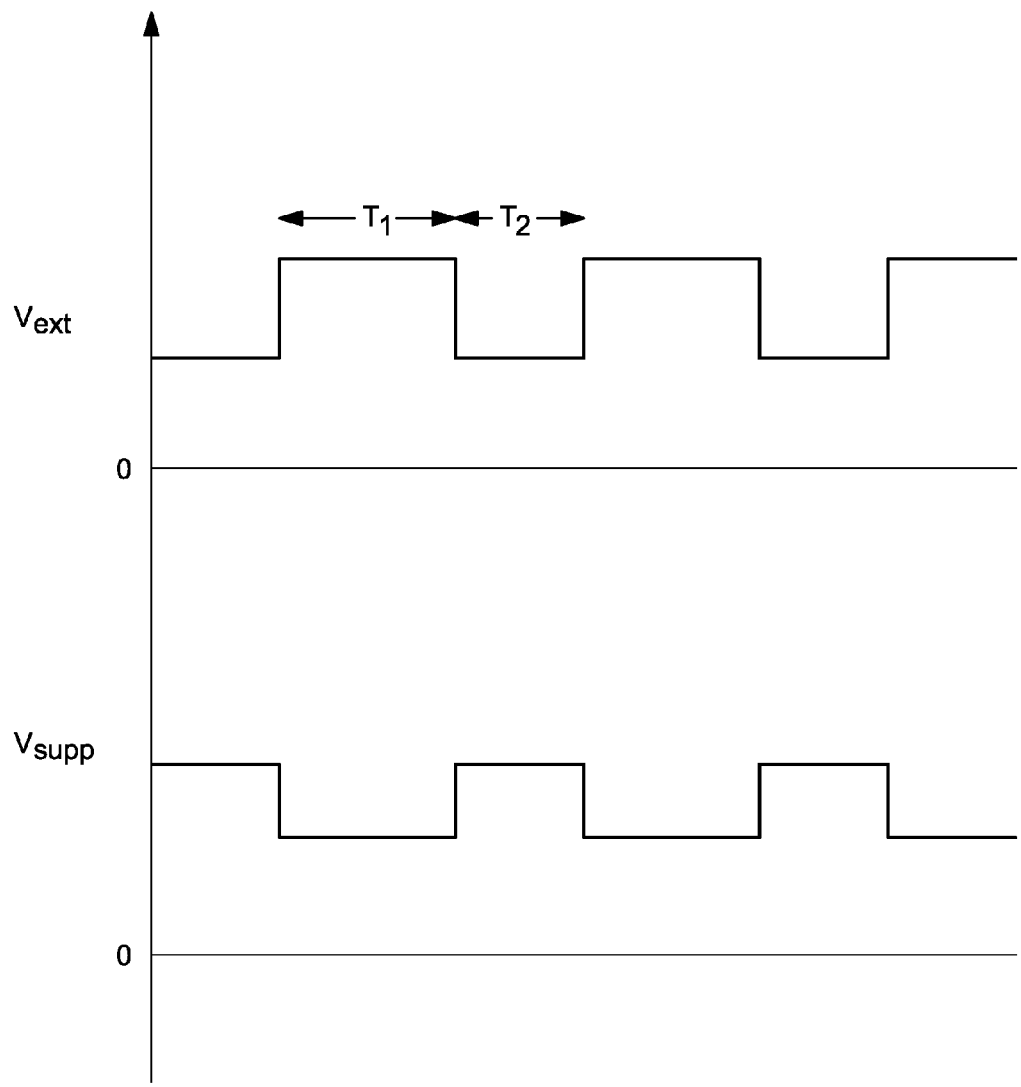
FIG. 3 shows a timing diagram according to one embodiment.

FIG. 3 shows a representative waveform of the voltage supplied by the extraction power supply 140 ($V_{ext}$) and the voltage supplied by the suppression power supply 160 ($V_{supp}$) as a function of time. During time T1, the magnitude of the voltage output by the extraction power supply 140 is increased, which increases the energy of the ions exiting the ion source 120. To maintain proper ion beam quality, such as width, uniformity, angle and shape, the suppression power supply 160 may also vary its voltage output during this time. The ion beam 165 produced during T1 is used to create the highly doped region 20. During time T2, the magnitude of the voltage output from the extraction power supply 140 is reduced, thereby reducing the energy of the exiting ions. As before, the suppression power supply 160 may change its output based on the voltage ($V_{ext}$) being provided by the extraction power supply 140. These lower energy ions are used to create the heavily doped surface region 10. The time defined by T1 and T2 is one implant cycle and performs two implants resulting in the desired dopant profile.

In one particular embodiment, the energy of the ion beam 165 during time T1 may be 10 keV or higher, while the energy is reduced to 7.5 keV or lower during time T2. In this configuration, the power supplied by the ionizing power supply 115 to the ion source 110 may be unchanged during T1 and T2.

Thus, in the first embodiment, the conditions within the ion source, such as ionization energy, gas species and gas dilution, are unchanged during the various implant periods. Further, although two different extraction voltages are described, the disclosure is not limited to only two different energy levels. Other dopant profiles may be created using three or more different extraction voltages.

Figure 4:
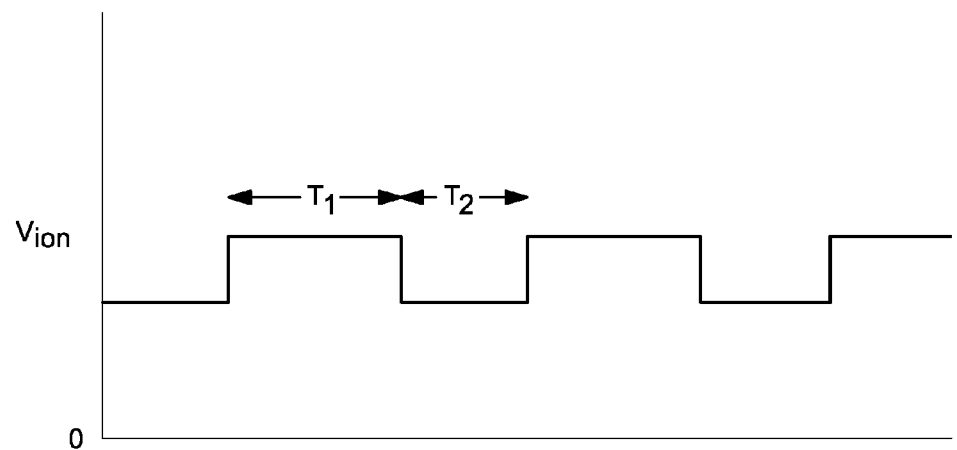
FIG. 4. is a timing diagram according to another embodiment.

According to a second embodiment, the desired dopant profile can be achieved by varying the composition of ions that form the ion beam 165. For example, a gas, such as $B_2H_6$, is supplied from the gas source 120 to the ion source 110. As shown in FIG. 4, during duration T1, the magnitude of the voltage output by ionization power supply 115 ($V_{ion}$) is set to a first value. This voltage is significant enough to ionize the source gas into a first set of ions, which may comprise lower mass ions, such as $B^+$, $H^+$. These ions are extracted through the extraction electrode 130, and directed toward the workpiece 170. Since the ions are lower mass, they tend to implant deeper in the workpiece 170, thereby creating the highly doped region 20 (See FIG. 1). During a second duration T2, the magnitude of the ionization voltage ($V_{ion}$) is reduced. This reduction in ionization energy still allows ionization of the source gas. However, a second set of ions, which may comprise higher mass ions, such as $B_2H_x^+$, is created. These higher mass ions are extracted from the ion source 110 and pass through the extraction electrode 130. These higher mass ions tend in result in a shallower implant, and can be used to form heavily doped surface region 10 (see FIG. 1). Again, although two different ionization voltage levels are shown, the disclosure is not limited to this embodiment. Of course, other gases may be used besides $B_2H_6$. In these other embodiments, the first set of ions and the second set of ions are still formed using the two different ionization voltages ($V_{ion}$).

Figure 5:
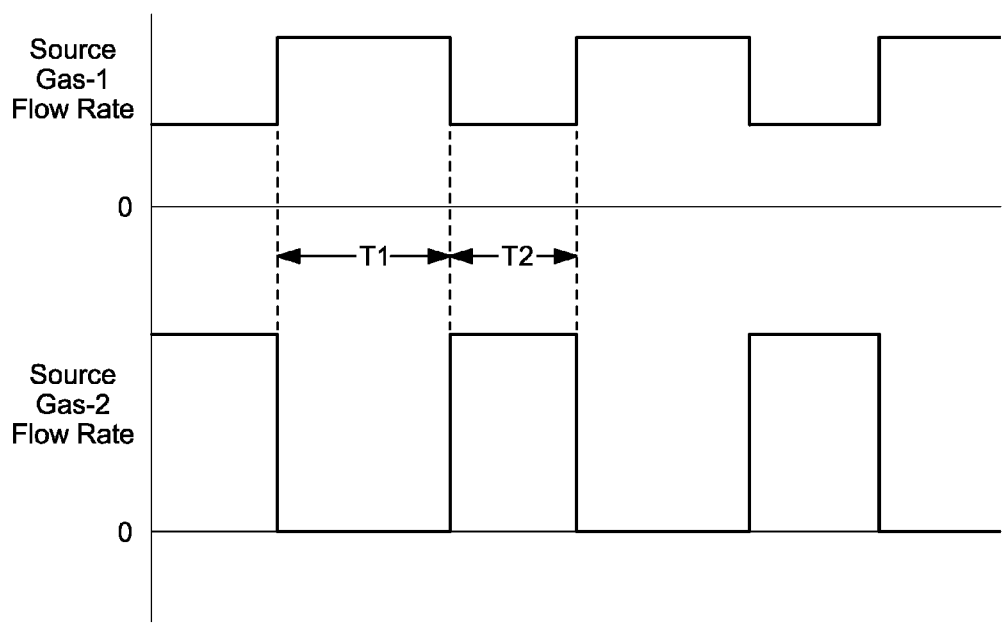
FIG. 5 is a timing diagram according to another embodiment.

In a third embodiment, two or more source gasses may be used. These gasses may be selected based on the size and type of ions produced. For example, the two gasses may have a common dopant species, with other components. For example, if the desired dopant is boron, the source gasses may be selected from hydrides, such as $B_2H_6$, and fluorides, such as $BF_3$ or $B_2F_4$. In the case of phosphorus, the source gasses may be a hydride, such as $PH_3$, or a fluoride, such as $PF_3$. This list is only illustrative and is not intended to recite all possible source gasses. FIG. 5 shows a graph representing the flow of two different source gasses into the ion source 110 as a function of time. During duration T1, the flow of the second source gas is reduced, or stopped, and the flow of the first source gas is increased. During duration T2, the flow of the second source gas is increased, while the flow rate of the first source gas is reduced or stopped. Note that while FIG. 5 shows a change in the flow rate of both gasses, this is not required. The flow rate of one of the source gasses may remain constant while the flow rate of the second source gas is varied.

The use of different forms of the dopant produces different sets of ions, which may have different implant characteristics. For example, ionization of fluorides tends to generate a first set of ions, which include higher mass ion species such as, for example, $BF_2^+$, $BF_3^+$, $PF_2^+$ and $PF_3^+$. In contrast, ionization of hydrides, such as $B_2H_6$, for example, tends to generate a second set of ions, which include lower mass ion species, such as, for example, $B^+$ and $B_2H_x^+$. Thus, the first set of ions produced by the ionization of fluorides may be better suited to create the heavily doped surface regions 10 (see FIG. 1), while the second set of ions produced by the ionization of hydrides are used to create the highly doped regions 20.

The concepts shown in FIG. 4 and FIG. 5 may also be combined, such that the ionization voltage ($V_{ion}$) is varied as the source gas flow rates are changed. For example, since fluorine tends to produce higher mass ion species, which do not penetrate as deeply into the workpiece 170, it may be preferable to use fluorides for the shallow implant. The generation of the first set of ions, which are higher mass ion species, may be enhanced by decreasing the ionization energy while fluorides are flowing in the ion source 110. In this way, ions, such as $BF_2^+$ or $PF_2^+$ are created. Similarly, since hydrides create a slightly depositing environment and may be better suited for shallow implants, the ionization energy may be reduced. This reduction will serve to ionize the source gas, but the resulting ions are much heavier, such as $PH_2^+$ and $B_2H_x^+$. These heavier ions will provide a shallower implant, thereby resulting in heavily doped surface region 10.

In another embodiment, the ratio of the two source gasses may be varied. For example, the first source gas may be the desired molecule, such as $B_2H_6$, while the second source gas may be a non-dopant, such as $H_2$. By varying the amount of non-dopant, the concentration of dopant is correspondingly affected.

In embodiments where a mask 190 is employed, such as selective emitter configurations, the mask 190 may be loaded on the workpiece support 180 during T2 to create regions having lower contact resistance (i.e. a heavily doped surface region). The mask 190 would be unloaded from the workpiece support 180 during T1 so that the emitter region (i.e. the highly doped region 20) is implanted throughout the workpiece 170. In one embodiment, the loading/unloading of the mask 190 takes place outside the ion beam path 165 during the transition between T1 and T2.

In embodiments where a mask 190 is not employed, the transition between T1 and T2 may occur when the workpiece 170 is not in the path of the ion beam 165. However, in embodiments where some amount of overdosing is acceptable, the workpiece 170 may be exposed to the ion beam 165 during the transition between T1 and T2.

It is also noted that the various techniques described above, the modulation of the extraction voltage, the modulation of suppression voltage, the modulation of the ionization voltage, and the selection of a plurality of source gasses, may be combined as well. In one embodiment, all of these parameters are varied to create a desired dopant profile. In other embodiments, one or more of the parameters are varied.

Crystalline silicon solar cell manufacturing typically requires thermal process steps. During thermal process steps, such as an anneal, dopants in the silicon may diffuse and any dopant distribution may change.

Thus, certain techniques may be used to reduce the alteration of the dopant profile caused by anneal. In one embodiment, an anneal cycle of high temperature and short duration is used to limit the diffusion of the dopant within the workpiece. The anneal may be performed using a tube furnace, rapid thermal anneal (RTA, which may be a millisecond anneal), a laser anneal or an inline/continuous belt type furnace. Higher temperature, such as 800-1100° C., anneal ensures higher dopant activation fraction, whereas the short duration at the high temperature, less than or equal to 45 min, leads to a desired dopant profile. Similarly, for RTA, the high temperature peak duration could be as short as few milliseconds, and for laser anneal, the pulse duration could be as short as few nanoseconds, but the total processing duration at high temperature (≥800° C.) should not exceed 45 minutes in some instances. By controlling the spike (high temperature peak) duration during the furnace annealing, RTA or laser annealing, the dopant profile can be controlled, which results in the desired dopant profile. Following the high temperature peak processing, processing duration at lower temperatures, e.g. >700° C., should not exceed 180 minutes in some instances to maintain the optimal dopant distribution.

In another embodiment, the anneal is performed in an oxygen rich environment to further control the width of the heavily doped surface region. The width of this heavily doped surface region can be controlled by controlling the oxide thickness, such as to between 1 and 30 nm. An oxygen rich environment may be comprised of only $O_2$ ambient or may be a mixture of $O_2$ and a carrier gas (e.g. $N_2$, Ar, etc.). Furthermore, the ratio of $O_2$ to the carrier gas could be as low as 1% depending on the other oxidation conditions. This oxide thickness may be controlled by modulating the various process parameters, such as oxygen flow rate (which may be, for example, between 1 and 60 sccm), oxidation time (which may be, for example, between 60 seconds and 600 seconds) and temperature (which may be the same as annealing temperature range in one embodiment).

The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method of creating a desired dopant profile in a workpiece, using an implant system comprising an ion source in communication with a gas source and an ionization power supply, and an extraction electrode in communication with an extraction power supply, comprising:
   introducing a gas comprising a dopant from the gas source into the ion source;
   energizing the ion source at a first ionization voltage using the ionization power supply to ionize the gas to create a first set of ions;
   energizing the extraction electrode using the extraction power supply so as to extract the first set of ions from the ion source and direct the ions toward the workpiece;
   implanting the first set of ions in the workpiece at a first depth;
   energizing the ion source at a second ionization voltage, lower than the first ionization voltage, using the ionization power supply to ionize the gas to create a second set of ions, said second set of ions having higher mass than said first set of ions;
   energizing the extraction electrode using the extraction power supply so as to extract the second set of ions from the ion source and direct the ions toward the workpiece;
   implanting the second set of ions in the workpiece at a second depth, the second depth less than the first depth; and
   performing a thermal cycle so as to allow the dopant to diffuse into the workpiece.

2. The method of claim 1, wherein the thermal cycle is selected from the group consisting of rapid thermal anneal, millisecond anneal and laser anneal.

3. The method of claim 1, wherein the thermal cycle is performed in an environment comprising oxygen.

4. The method of claim 1, wherein the workpiece is a solar cell, wherein the first set of ions are used to create an emitter region in the solar cell.

5. The method of claim 1, wherein the workpiece is a solar cell, wherein the second set of ions are used to create a heavily doped surface region.

6. A method of creating a desired dopant profile in a workpiece, using an implant system comprising an ion source in communication with at least two gas sources and an ionization power supply, and an extraction electrode in communication with an extraction power supply, comprising:
   introducing a first gas comprising a dopant from the gas source into the ion source;
   energizing the ion source using the ionization power supply to create a first set of ions from the first gas;
   energizing the extraction electrode using the extraction power supply so as to extract the first set of ions from the ion source and direct the first set of ions toward the workpiece;
   implanting the first set of ions in the workpiece at a first depth;
   introducing a second gas from the second gas source into the ion source, wherein the second gas is different from the first gas and comprises the same dopant as the first gas;
   energizing the ion source using the ionization power supply to create a second set of ions from the second gas, wherein the second set of ions are different from the first set of ions and comprises the same dopant as the first set of ions;
   energizing the extraction electrode using the extraction power supply so as to extract the second set of ions from the ion source and direct the ions toward the workpiece;
   implanting the second set of ions at a second depth; and
   performing a thermal cycle after the first set of ions and the second set of ions are implanted so as to allow the dopant to diffuse into the workpiece
   wherein the first gas comprises a fluoride and the second gas comprises a hydride and wherein the second depth is greater than the first depth.

7. The method of claim 6, wherein the thermal cycle is selected from the group consisting of rapid thermal anneal, millisecond anneal and laser anneal.

8. The method of claim 6, wherein the thermal cycle is performed in an environment comprising oxygen.

* * * * *